(12) United States Patent
Nolan

(10) Patent No.: US 6,636,369 B2
(45) Date of Patent: Oct. 21, 2003

(54) DEVICE FOR MAINTAINING ALIGNMENT BETWEEN A FOCAL POINT OF A LASER BEAM AND A SLIT APERTURE

(75) Inventor: John Nolan, Bradford, MA (US)

(73) Assignee: Agfa Corporation, Wilmington, MA (US)

( * ) Notice: Subject to any disclaimer, the term of this patent is extended or adjusted under 35 U.S.C. 154(b) by 153 days.

(21) Appl. No.: 09/993,734

(22) Filed: Nov. 14, 2001

(65) Prior Publication Data
US 2003/0090817 A1 May 15, 2003

(51) Int. Cl.[7] ............................... G02B 5/04; G02B 7/18
(52) U.S. Cl. ......................................... 359/831; 359/837
(58) Field of Search .................................. 359/831, 833, 359/837; 356/400, 614

(56) References Cited

U.S. PATENT DOCUMENTS 4,916,534 A * 4/1990 Takhashi et al. .............. 348/67
6,497,490 B1 * 12/2002 Miller et al. ................. 359/614

* cited by examiner

Primary Examiner—Mark A. Robinson
(74) Attorney, Agent, or Firm—Joseph D. King

(57) ABSTRACT

An optical wedge compensates for a vertically drifting laser beam in response to ambient temperature fluctuations. A slit sensor is formed onto a surface of the wedge to separate a single light pulse from a plurality of light pulses. A reflective filter layer is applied to a side opposite the slit sensor so an incident laser beam is attenuated thereby precluding damage to the slit sensor. The reflective filter coating further filters out unwanted light energy. The wedge is shaped so as to maintain a position of a focal point of a laser beam on the slit sensor and to prevent reflected light from damaging a laser source.

29 Claims, 11 Drawing Sheets

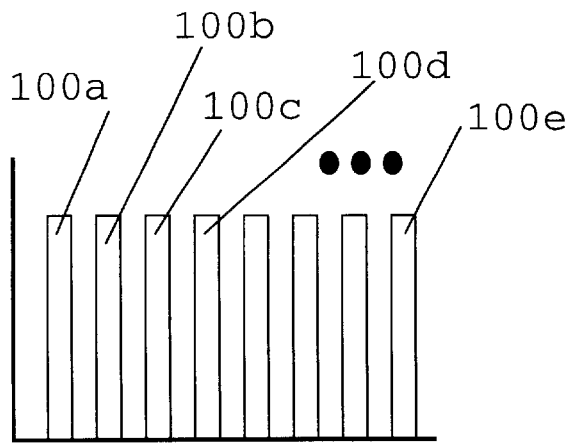
Figure 5a
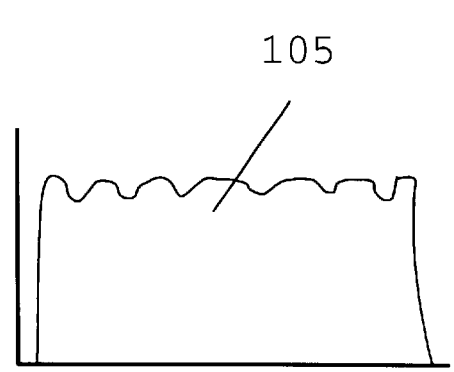
Figure 5b
Figure 5c
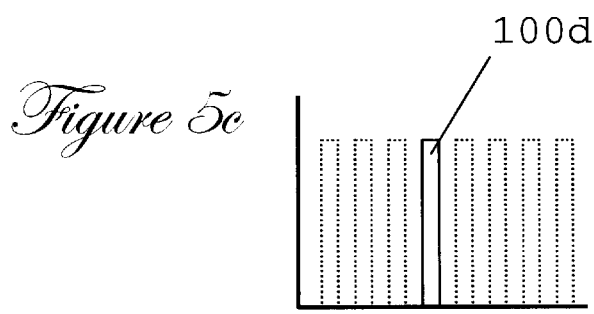

DEVICE FOR MAINTAINING ALIGNMENT BETWEEN A FOCAL POINT OF A LASER BEAM AND A SLIT APERTURE

BACKGROUND OF THE INVENTION

The invention generally relates to the field of imaging printing plates on a platesetter or imaging film on an imagesetter.

The process of transferring text and/or graphic information from electronic form to visual form on an imagable medium is called imaging. The information can be transferred to an imagable media using light such as produced by a laser beam or beams. The imagable media may be a printing plate or film that is sensitive to the wavelength of the laser beam(s) used to accomplish imaging.

The laser beam used to image a printing plate or film is often modulated with pulses. The laser beam must be calibrated to assure proper exposure of the imagable media is achieved.

SUMMARY OF THE INVENTION

A laser beam used to image a printing plate and/or film media is focused to a sharp point. This focal point is aligned on or with the surface of the media to be imaged. If the focal point of the laser beam falls short of the media surface, or is located beyond the media surface, the resulting image placed on the media is distorted. Consequently, proper positioning of the focal point of the laser beam or beams is crucial to producing a distortion free image on the media.

Preparation for imaging a printing plate or film includes calibration of the laser beam or beams. Various parameters of a laser beam (hereafter laser beam means a single beam OR may mean a plurality of laser beams) must be measured at precisely the focal point of the laser beam. This is often accomplished with a photo-detector or other light sensor. Often a single laser source or a plurality of laser sources are configured to provide a single line of laser light that is coupled to a modulating device such as a grating light valve (GLV). The GLV effectively creates a large number of individual light beams from the single laser light line. This is accomplished by manipulating small components inside the GLV so each individual light beam is turned on, and then off resulting in a pulse of light. Consequently, the original single line of laser light supplied to the GLV is transformed into a plurality of light pulses forming a train of pulses.

Characteristics of each pulse must be measured. Since each pulse must be measured, a slit sensor can be employed to separate or isolate a single pulse from the rest of the pulses. The slit sensor must be placed at precisely the focal point of the laser beam so as to measure the characteristics of the portion of the laser beam that actually strikes the surface of the imageble media. The slit sensor reflects all other pulses except a single pulse. This reflected light energy must not be directed back toward the laser source (or GLV) producing the pulsed laser beam as the laser source or GLV may be damaged. Tilting the slit sensor results in an offset between the focal point of the laser beam and the actual slit introducing an error in the measurement. The problem is exacerbated by vertical movement of the laser beam as various components expand or contract due to temperature fluctuations.

What is needed is a device that allows a single pulse to be isolated from a plurality of pulses at the focal plane of a laser beam without damaging the laser source or GLV. Further, the device must compensate for a vertically drifting laser beam so the focal point of the laser beam remains precisely aligned on the portion of the device that separates the pulses.

An object of the invention herein is to maintain a position of the focal point of a laser beam onto a slit aperture as said laser beams drifts vertically.

A further object of the invention herein is to attenuate the amplitude of the laser beam before said laser beam illuminates said slit aperture.

Another object of the invention herein is to redirect light away from a laser beam source that is reflected by a surface of the invention.

An object of the invention herein is to separate a single pulse of light from a plurality of light pulses modulated onto said laser beam.

BRIEF DESCRIPTION OF THE DRAWINGS

The following description may be further understood with reference to the accompanying drawings in which:

FIGS. 5a–5e show laser pulses and the function of the slit sensor of FIG. 4.

The drawings are shown for illustrative purposes only, and are not to scale.

DETAILED DESCRIPTION OF THE INVENTION

Figure 1:
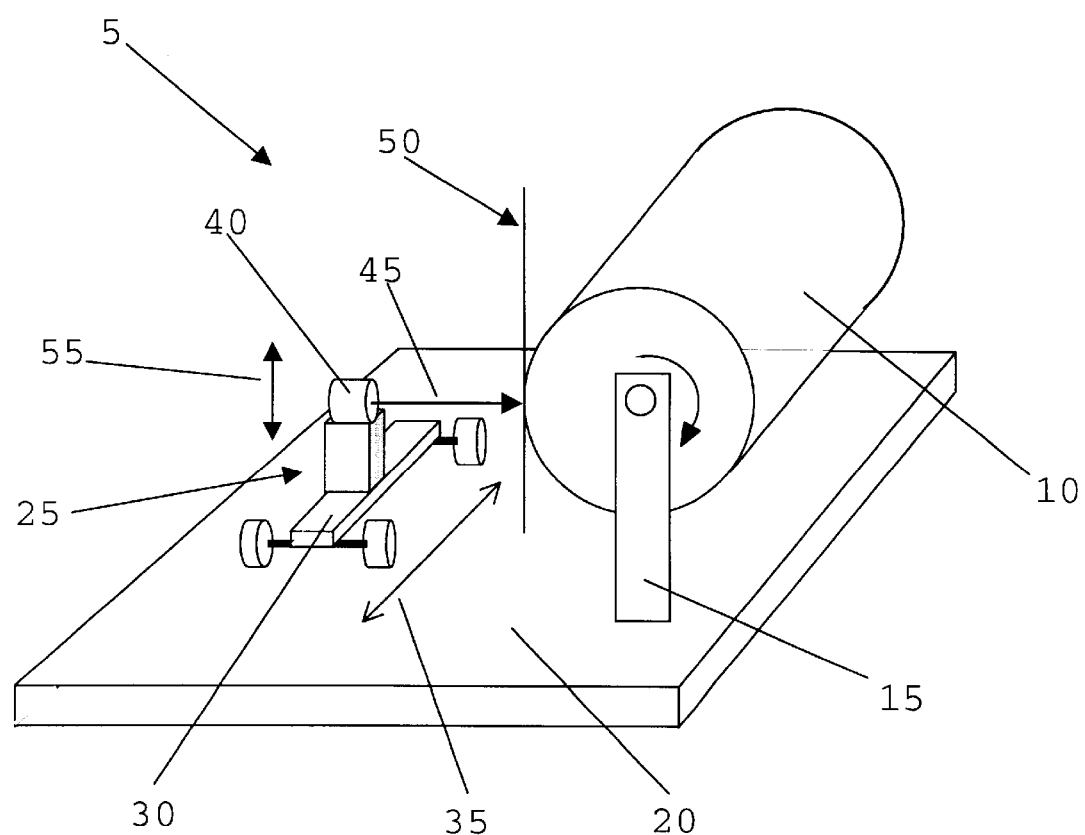
FIG. 1 is an external drum imaging machine with various components showing the need for the invention herein.

The invention herein is employed on an imaging machine 5 generally shown in FIG. 1. Imaging machine 5 may be of the external drum type in which an imageble media is supported on the outside surface of a drum 10. However, the invention is not limited to machines of the external drum type, and may be used with machines employing internal drum configurations (not shown) and/or with flatbed imagers.

Imaging machine 5 employs a laser source 40 producing at least one laser beam 45 which is separated into a plurality of laser beams and modulated to form pulses of light. The modulating apparatus is not shown, and only a single laser beam 45 will be used to describe the invention herein for simplicity. It is understood that the plurality of laser light pulses described infra may each represent one of the plurality of light beams produced by said GLV or the equivalent thereof as described supra.

Laser source 40 is moveably mounted on optical mounting apparatus generally shown at 25. Apparatus 25 may include a carriage assembly 30 operative to move laser source 40 along a direction indicated by arrow 35. Drum 10 is supported by frame 15 on a base 20 also used to support optical mounting apparatus 25. Laser beam 45 is directed toward drum 10 such that a focal point of laser beam 45 is located at the surface of an imageable media (not shown) mounted on drum 10. A focal plane 50 is shown in FIG. 1 representing the imageable surface of an imageable medium such as a printing plate or film.

Figure 2:
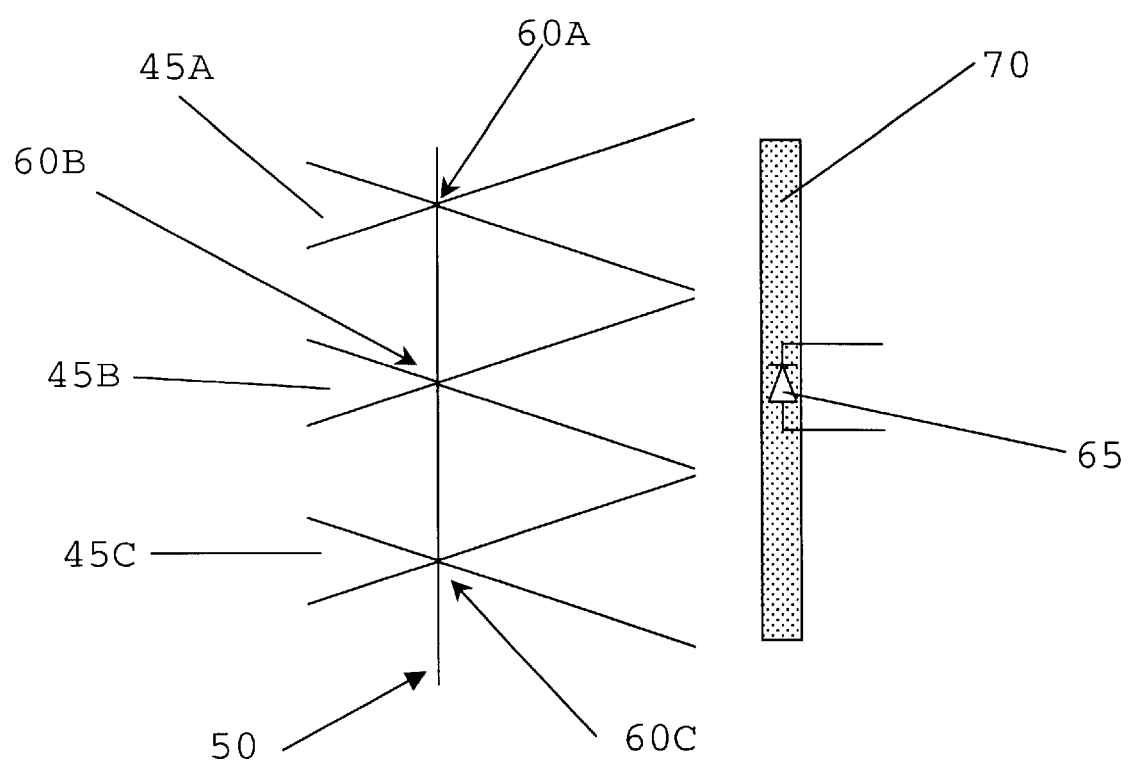
FIG. 2 shows how a laser beam drifts as the components of FIG. 1 expand or contract and placement of a light detector forming a plane of focus.

Various components including 10, 15, 20, 25, and 30 of imaging machine 5 expand and/or contract in response to ambient room temperature fluctuations causing laser beam 45 to move vertically as shown by arrow 55 relative to drum 10. The vertical movement is best represented in FIG. 2. Laser beam 45 moves vertically up and/or down as shown by 45A, 45B, and 45C. Laser beam 45A, 45B and 45C has a focal point shown by 60A, 60B, and 60C respectively. Focal points 60A, 60B, and 60C are shown aligned with, or positioned on, focal plane 50 that represents the surface of an imageable medium mounted on drum 10 as described supra. It is also understood that laser beam 45A, 45B and 45C are pulsed, forming a light pulse as is described and shown infra.

Various parameters of laser beam 45 are measured using a light sensor 65 having a receiving area 70. The light sensor may be a diode photo-detector, photo-transistor, photo-multiplier tube or any other type of light sensor.

Figure 3:
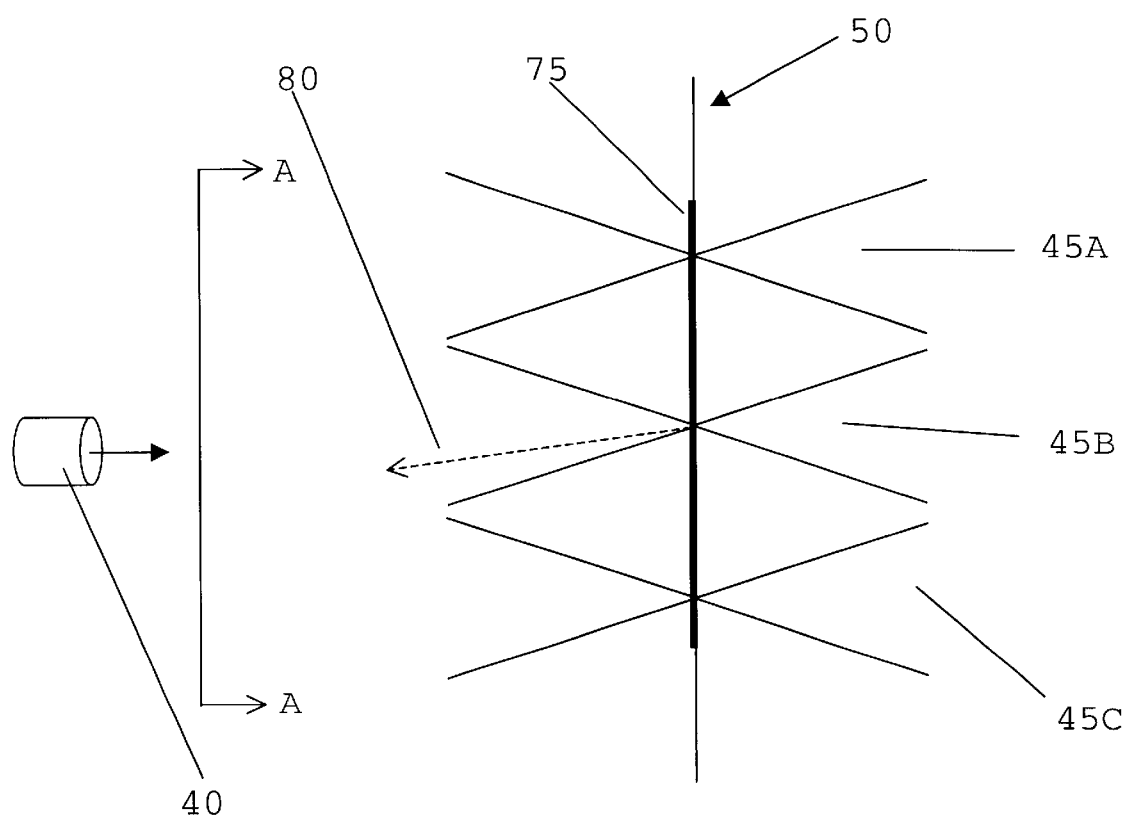
FIG. 3 shows a slit sensor placed at a focal plane of the laser beam of FIG. 2.

Laser light beam 45 is sampled using a device called a slit sensor 75 which is positioned at the focal plane 50, in front of light sensor 65 as shown in FIG. 3. The slit sensor 75 and light sensor 65 are placed slightly away from an end of drum 10 (not shown). This is because it is impossible to place slit sensor 75 and light sensor 65 at focal plane 50, and in front of drum 50 due to volume requirements.

Figure 4:
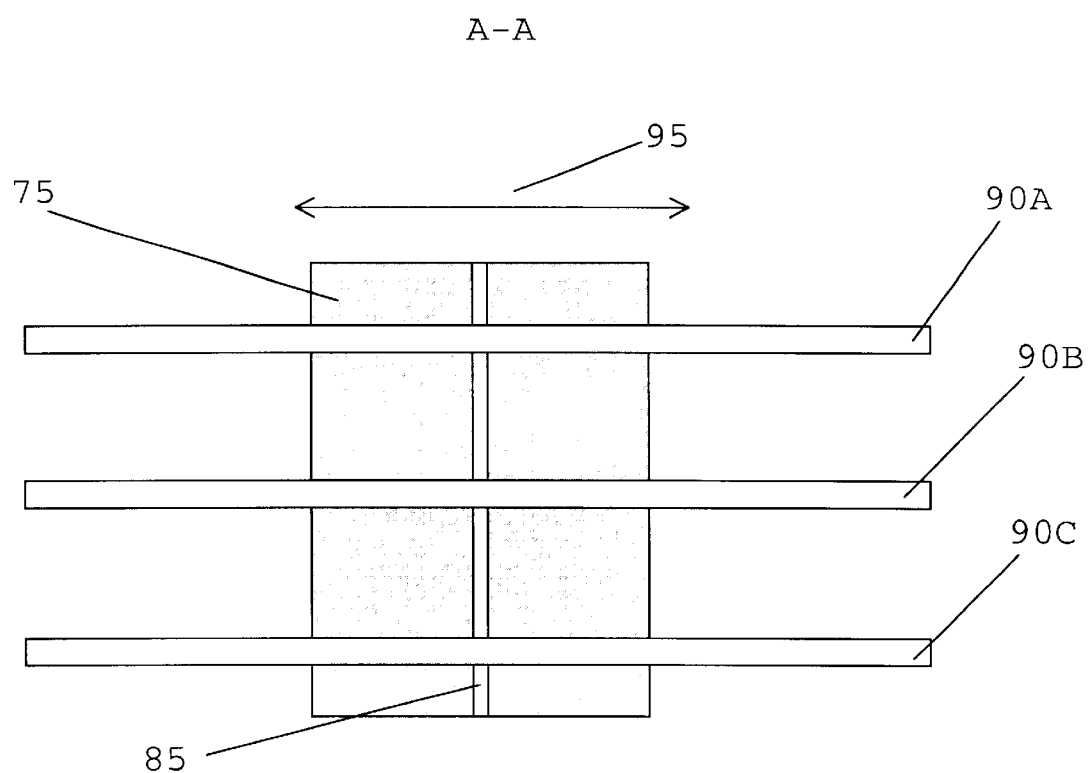
FIG. 4 is a front view of the slit sensor and laser beam of FIG. 3.

Light beam 45 is scanned across slit sensor 75 as shown in FIG. 4 by arrow 95. Laser lines 90A, 90B, and 90C correspond to laser beam 45A, 45B and 45C respectively and are another view of said beam as seen from A—A in FIG. 3. The actual slit 85 in slit sensor 75 is shown in FIG. 4. The shape of slit 85 may be other than what is shown depending on specific requirements.

Figure 5D:
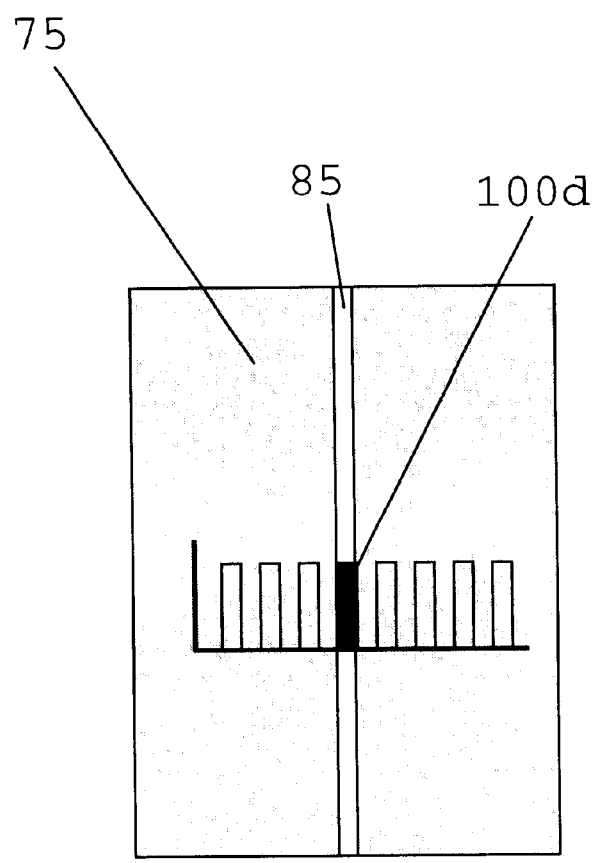
Figure 5E:
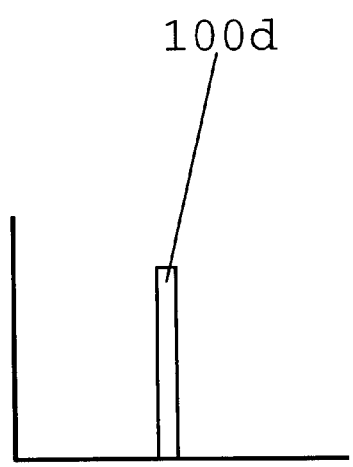

Laser beam 45A, 45B and 45C is modulated to form a plurality of pulses 100*a*, 100*b*, 100*c*, 100*d*, and 100*e* shown in FIG. 5*a*. If all of said pulses 100*a*, 100*b*, 100*c*, 100*d*, and 100*e* were to illuminate light sensor 65 at once, the sensor would integrate the all pulses forming a complex waveform 105 similar to the waveform shown in FIG. 5*b*. Slit sensor 75 is used to isolate or separate a single pulse 100*d* from the rest of the pulses as shown in FIGS. 5*c*, 5*d*, and 5*e*. Slit 85 is designed to have a width W such that only a single pulse is allowed to pass while blocking all other pulses. As light beam 45 is moved across slit sensor 75 as shown in FIGS. 4 and 5*d*, each individual pulse is allowed to pass through slit 85, one at a time. This allows light sensor 65 to accurately measure each pulse separately without interference from any of the other pulses.

Figure 6:
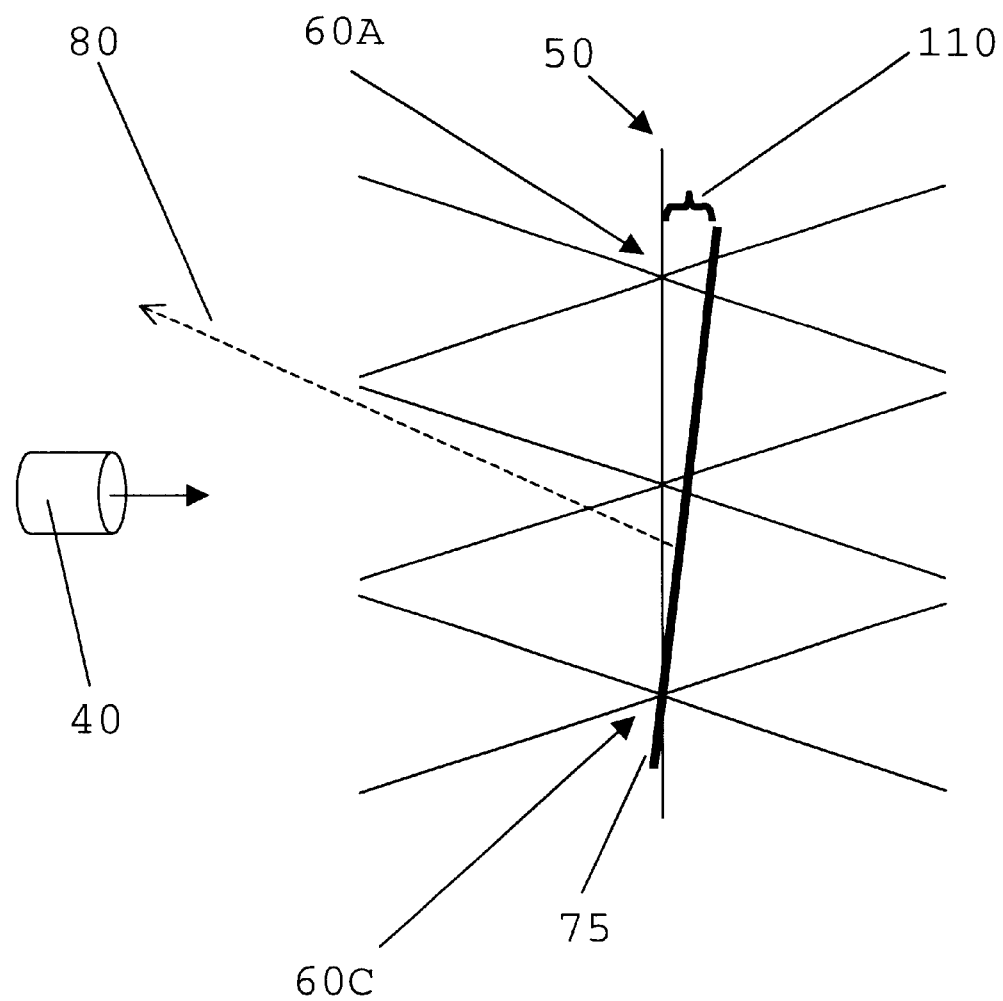
FIG. 6 shows the deviation of a portion of a slit sensor from the focal plane of FIG. 3 as the slit sensor is tilted.
Figure 7:
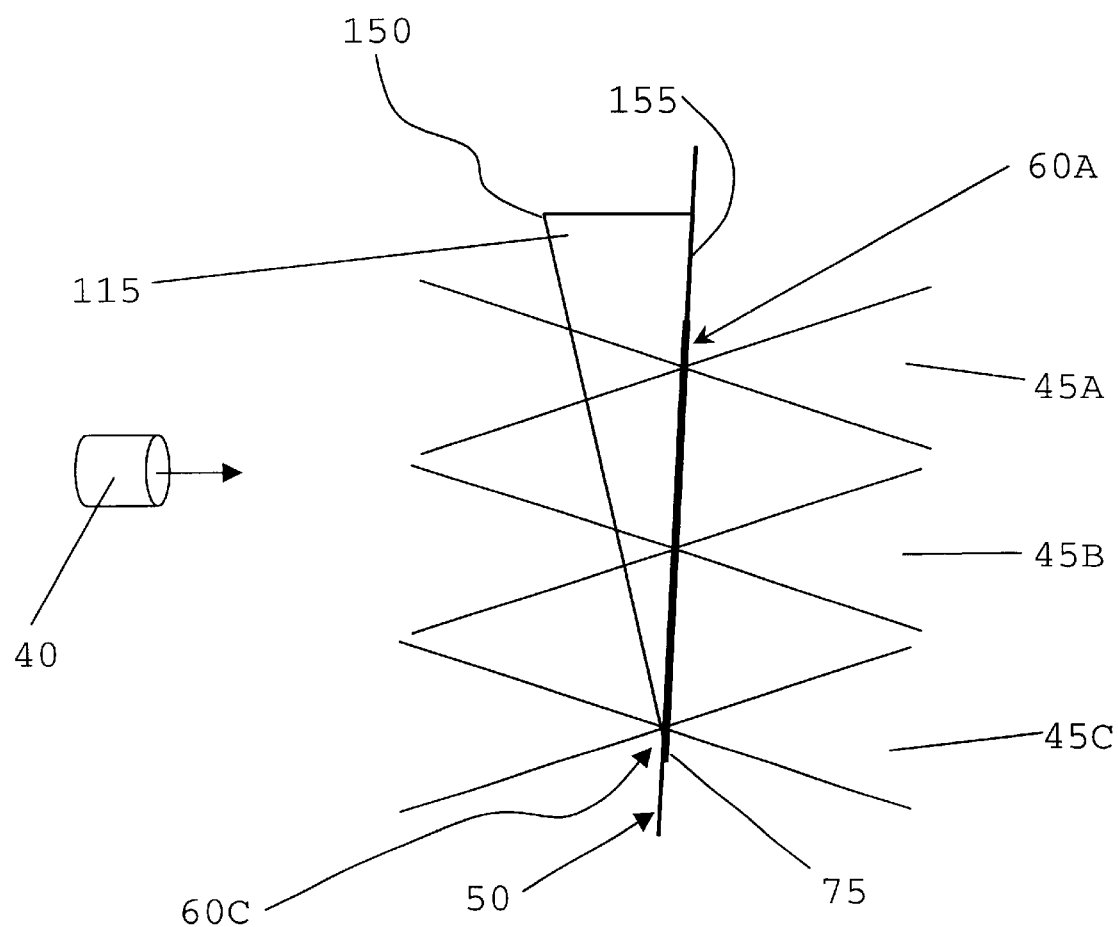
FIG. 7 shows how a portion of the invention herein provides variable shifting of a focal point of the laser beam of FIG. 6.

When laser beam 45 strikes slit sensor 75, a portion of the light energy 80 is reflected as shown in FIG. 3. If the reflected light energy 80 enters source 40 (or GLV modulator not shown) damage can occur to source 40. A solution is to tilt slit sensor 75 away from the vertical (either direction is suitable) as shown in FIG. 6. This re-directs reflected light energy 80 away from laser source 40 (or GLV or other modulator) preventing damage to source 40. However, focal point 60A is no longer positioned at or on slit sensor 75 as shown by 110 in FIG. 6, while focal point 60C remains positioned on slit sensor 75. The result is a measurement of light beam 45 is performed at other than the desired focal point 60A. The invention herein solves this problem by use of a wedge shape piece of material 115 having an index of refraction as shown in FIG. 7. As is well known in the art of optics, material having an index of refraction different than air shifts or moves a focal point of a light beam. The magnitude of the shift is dependent upon the thickness of the material and the value of the index of refraction (in addition to other variables). The value of the index of refraction to be used with the invention herein is dependent upon the scenario in which the invention is to be used, and is a design choice. Optical wedge 115 is used to significantly move focal point 60A of laser beam 45A while at the same time, keeping focal point 60C of laser beam 45C at very near the same position. This is because laser beam 45A must travel a longer distance through optic wedge 115 than laser beam 45C does. Laser beam 45A travels through the thick portion of the optic wedge 115, and laser beam 45C travels through the thinnest portion of optic wedge 115 as shown in FIG. 7.

Optic wedge 115, having an index of refraction greater than air in the preferred embodiment, is placed so the thinnest portion of the wedge is at the focal point 60C of laser beam 45C which represents the lowest vertical position laser beam 45 can drift to. As laser beam 45 drifts upward, more material is introduced into the optic pathway of laser beam 45 causing focal point 60 to shift by a larger amount. This variable shift in focal point position, proportional to the thickness of the optic wedge 115, re-aligns the loci of focal points 60A, 60B, and 60C for laser beams 45A, 45B, and 45C respectively, onto tilted slit sensor 75, which is formed on the backside of optic wedge 115 as shown in FIG. 7.

Figure 8:
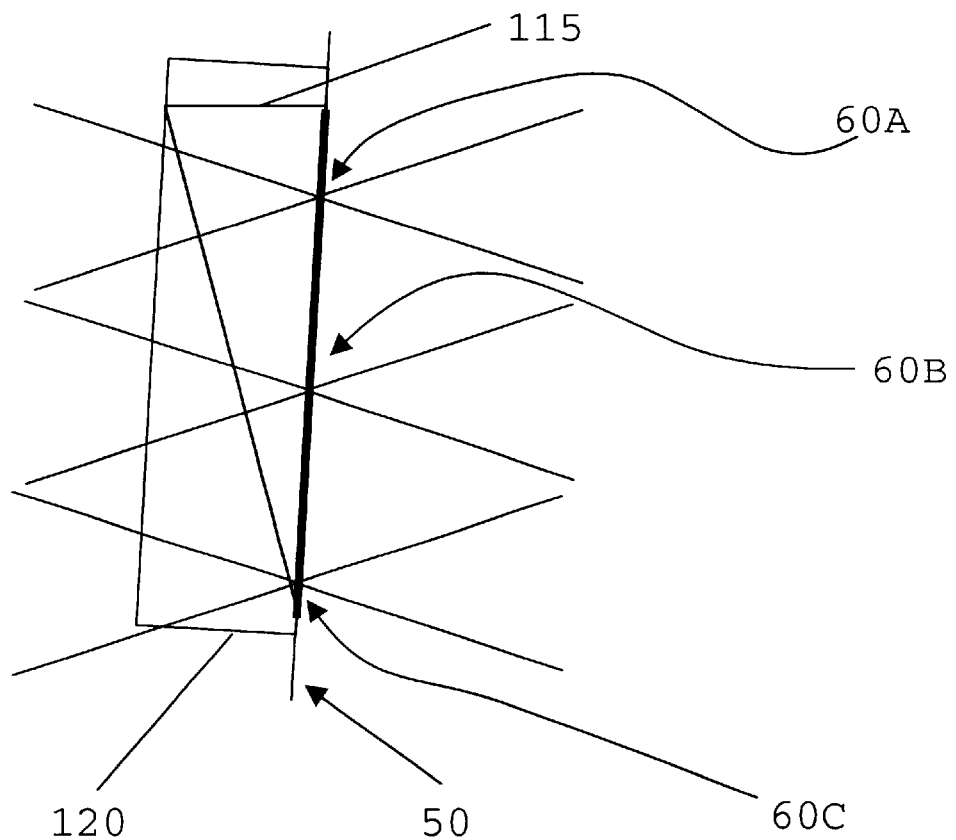
FIG. 8 shows how the optical wedge portion of the invention is formed from a slab of optical material.

Optic wedge 115 may be formed from a slab of optical glass 120 as shown in FIG. 8. The first step is to calculate the desired tilt angle 125 of the front surface 150 shown in FIG. 9*c* in order to achieve the desired angle of reflection to re-direct reflected energy 80 away from source 40 or any other component. Secondly, the plane of focus within the glass 120 created by the index of refraction is calculated yielding an angle 130 relative to the front surface 150. The optic wedge is formed using angle 130 and angle 125.

Figure 9A:
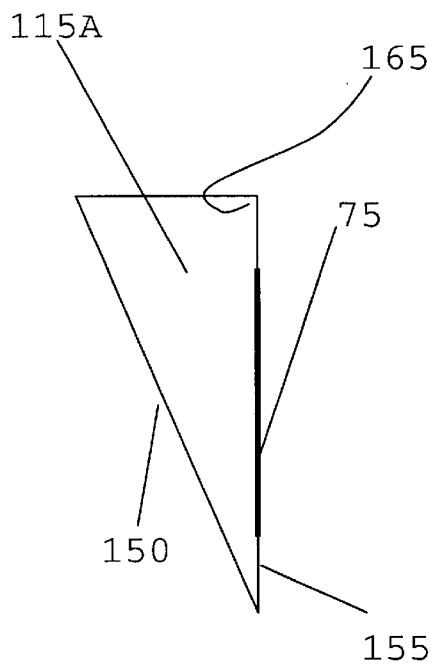
FIGS. 9a–9c are alternate embodiments of the optical wedge portion of the invention herein.
Figure 9B:
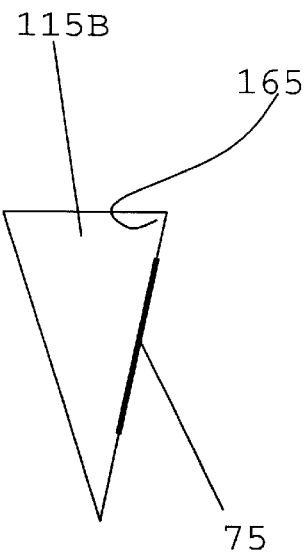
Figure 9C:
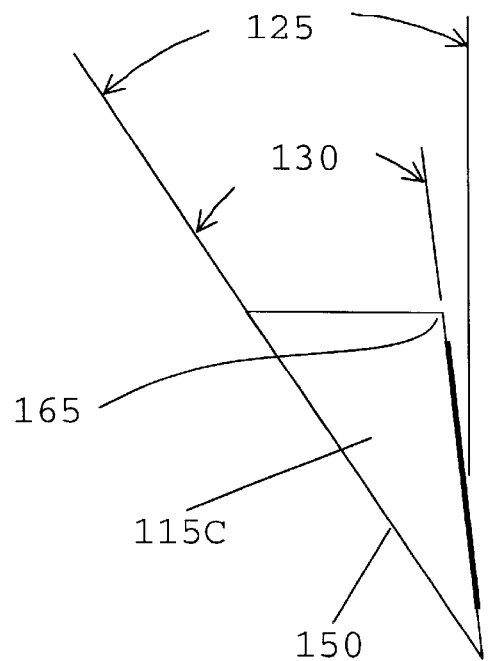

Depending on the design requirements, alternate embodiments of the optical wedge are possible as shown in FIGS. 9*a*, 9*b*, and 9*c*. One variable is angle 165 shown in three configurations, perpendicular to an adjacent side, less than 90 degrees to an adjacent side or greater than 90 degrees to an adjacent side respectively. Further surfaces 150 and/or 155 may be angled differently than as shown. For example, surface 150 in FIG. 9*a* is shown angled downward. Surface 150 may be angled upward.

Figure 10:
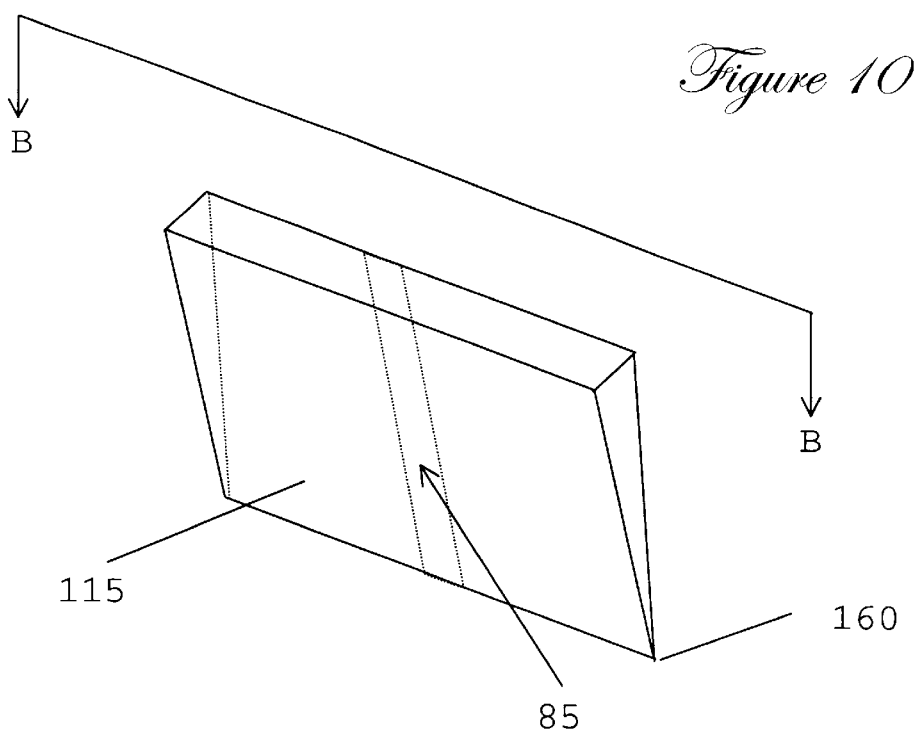
FIG. 10 is a perspective view of an embodiment of the invention herein.

A perspective view of optic wedge 115 is shown in FIG. 10 having slit 85 formed on one side. A feature of the invention herein is the relatively sharp edge 160 formed by two sides of optic wedge 115. This provides a very short optic pathway for laser beam 45. This short optic path in optic wedge 115 serves to shift a focal point 60C of laser beam 45C a very small amount as described supra. Optic wedges known in the art of optics do not have sharp edge 160, but are truncated.

Figure 11:
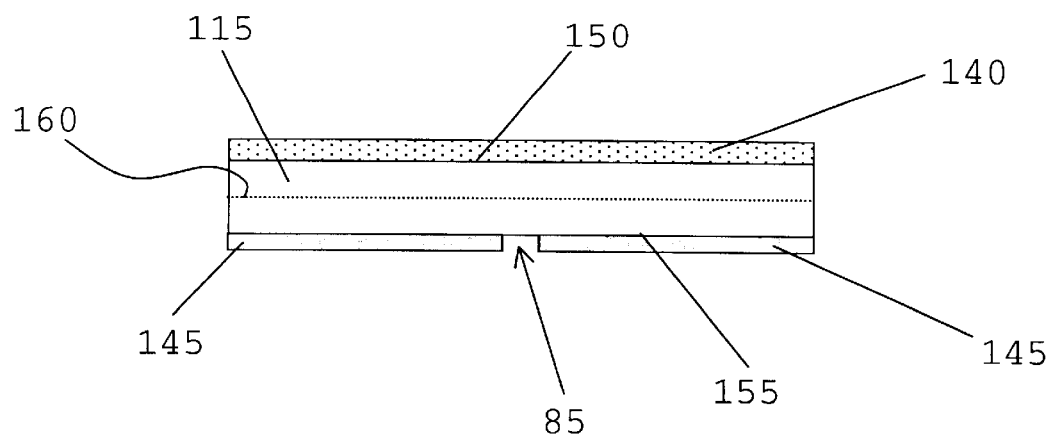
FIG. 11 is an alternate view of the invention of FIG. 11 showing all 3 layers of the invention.

Slit sensor 75 is formed on a side 155 of optic wedge 115 as shown in FIG. 11. A coating 145, opaque at least to the wavelength of source 40, is applied to a surface 155 of optic wedge 115 that faces detector 65. An aperture 85, preferably slit shaped, is formed into opaque coating 145 by etching away some of coating 145, or alternatively, by selectively applying coating 145 on areas of surface 155 other than in an area designated to form aperature 85. The purpose of coating 145 and aperture 85 is to allow only a single pulse at a time to illuminate detector 65 as described supra. Coating 145 may comprise gold, silver, chrome, aluminum, tin, titanium, tungsten or any other suitable material which blocks light from the source.

Another feature of the invention herein is a reflective filter layer 140 applied to front surface 150 of optic wedge 115. Reflective filter layer 140 attenuates the amplitude of laser beam 45 sufficiently so laser beam 45 does not damage opaque coating 145. Reflective filter layer 140 also filters out any stray or unwanted light that may ultimately illuminate detector 65 causing an erroneous measurement of laser beam 45. The type and thickness of the material used for reflective filter layer 140 depends upon the wavelength and power level of source 40, (in addition to other design variables) and is a design choice dependent upon the particular scenario. Many current, well known optic coatings are suitable for this application such as described and sold by Coherent Corporation.

Though the invention herein is described with reference to imaging machines in the graphic arts industry, the invention is not restricted to use in the graphics industry and may be used wherever a laser beam needs to have an optic parameter measured.

Those skilled in the art will appreciate that numerous modifications and variations may be made to the above disclosed embodiments without departing from the spirit and scope of the present invention.

I claim:

1. An optical wedge for shifting and maintaining a position of a focal point of an incident beam of light onto an aperture, said shift being proportional to a thickness of said optical wedge, said optical wedge comprising:
   a first planar side in the optical pathway of a beam of light, said first side positioned at a first angle relative to said beam of light;
   a reflective filter coating deposed on an outside surface of said first planar side between said beam of light and said optical wedge for attenuating said beam of light and for reflecting light having wavelengths other than said beam of light;
   a second planar side angularly positioned relative to said first planar side such that a second angle formed by said first side and said second side is less than 90 degrees thereof;
   an opaque coating deposed on an outside surface of said second side for blocking said beam of light; and
   an aperture formed into said opaque coating, said aperture operative to separate a single pulse of light from a plurality of light pulses.

2. The optical wedge of claim 1 wherein an end of said wedge forms a sharp edge.

3. The optical wedge of claim 1 wherein an angle formed by any two sides is non-orthogonal.

4. The optical wedge of claim 1 wherein said aperture has a shape that is generally slit like.

5. The optical wedge of claim 4 wherein said slit aperture extends from a first end of said optical wedge to a second end opposite said first end.

6. The optical wedge of claim 1 wherein said opaque layer comprises gold, silver, aluminum, chrome, titanium, tungsten or copper.

7. The optical wedge of claim 1 wherein said first angle formed by said beam of light and said first side is non-orthogonal.

8. An optical wedge for shifting a position of a focal point of an incident beam of light onto an aperture, said shift being proportional to a thickness of said optical wedge, said optical wedge comprising:
   a reflective filter layer in continuous and direct contact with a first outside surface of said optical wedge for attenuating a beam of light and for reflecting light having wavelengths other than said beam of light;
   an opaque layer in continuous and direct contact with a second outside surface of said optical wedge for blocking said beam of light; and
   an aperture formed into said opaque layer, said aperture operative to separate a single pulse of light from a plurality of light pulses.

9. The optical wedge of claim 8 wherein an end of said wedge forms a sharp edge.

10. The optical wedge of claim 8 wherein an angle formed by any two sides is non-orthogonal.

11. The optical wedge of claim 8 wherein said aperture has a shape that is generally slit like.

12. The optical wedge of claim 11 wherein said slit aperture extends from a first end of said optical wedge to a second end opposite said first end.

13. The optical wedge of claim 8 wherein said opaque layer comprises gold, silver, aluminum, chrome, titanium, tungsten or copper.

14. The optical wedge of claim 8 wherein said first angle formed by said beam of light and said first side is non-orthogonal.

15. A device for providing a variable optical path length operative to shift a focal point of an incident light beam onto an aperture in response to vertical movement of a moveable light source, said device comprising:
   a generally wedge shaped piece of optical glass;
   a reflective filter layer in continuous and direct contact with a first outside surface of said optical wedge for attenuating a beam of light and for reflecting light having wavelengths other than said beam of light;
   an opaque layer in continuous and direct contact with a second outside surface of said optical wedge for blocking said beam of light; and
   an aperture formed into said opaque layer, said aperture operative to separate a single pulse of light from a plurality of light pulses.

16. The optical wedge of claim 15 wherein an end of said wedge forms a sharp edge.

17. The optical wedge of claim 15 wherein an angle formed by any two sides is non-orthogonal.

18. The optical wedge of claim 15 wherein said aperture has a shape that is generally slit like.

19. The optical wedge of claim 18 wherein said slit aperture extends from a first end of said optical wedge to a second end opposite said first end.

20. The optical wedge of claim 15 wherein said opaque layer comprises gold, silver, aluminum, chrome, titanium, tungsten or copper.

21. The optical wedge of claim 15 wherein said first angle formed by said beam of light and said first side is non-orthogonal.

22. A device for providing a variable optical path length operative to shift a focal point of an incident light beam onto an aperture in response to vertical movement of a moveable light source, said device comprising:

a generally wedge shaped piece of optical glass;

a first planar side in the optical pathway of a beam of light, said first side positioned at a first angle relative to said beam of light;

a reflective filter coating deposed on an outside surface of said first planar side between said beam of light and said optical wedge for attenuating said beam of light and for reflecting light having wavelengths other than said beam of light;

a second planar side angularly positioned relative to said first planar side such that a second angle formed by said first side and said second side is less than 90 degrees thereof;

an opaque coating deposed on an outside surface of said second side for blocking said beam of light; and an aperture formed into said opaque coating, said aperture operative to separate a single pulse of light from a plurality of light pulses.

23. The optical wedge of claim 22 wherein an end of said wedge forms a sharp edge.

24. The optical wedge of claim 22 wherein an angle formed by any two sides is non-orthogonal.

25. The optical wedge of claim 22 wherein said aperture has a shape that is generally slit like.

26. The optical wedge of claim 25 wherein said slit aperture extends from a first end of said optical wedge to a second end opposite said first end.

27. The optical wedge of claim 22 wherein said opaque layer comprises gold, silver, aluminum, chrome, titanium, tungsten or copper.

28. The optical wedge of claim 22 wherein said first angle formed by said beam of light and said first side is non-orthogonal.

29. A method of measuring an optical parameter of a pulsed laser beam comprising the steps of:

providing an optical wedge comprising:
   a generally wedge shaped piece of optical glass;
   a reflective filter layer in continuous and direct contact with a first outside surface of said optical wedge for attenuating said laser beam and for reflecting light having wavelengths other than said laser beam;
   an opaque layer in continuous and direct contact with a second outside surface of said optical wedge for blocking said laser beam; and
   a slit-shaped aperture formed into said opaque layer, said aperture operative to separate a single pulse of light from a plurality of light pulses;

positioning said optical wedge so that said first outside surface of said optical wedge is located in the optical pathway of said laser beam, said first side positioned at an angle that is non-orthogonal to said laser beam; and detecting light from said laser beam after said light passes through said optical wedge.

* * * * *